June 7, 1960 D. D. HOLMES 2,939,950

COMBINED MANUAL AND AUTOMATIC GAIN CONTROL CIRCUIT

Filed July 1, 1957

INVENTOR.
DAVID D. HOLMES

BY [signature]

ATTORNEY 2,939,950
Patented June 7, 1960

2,939,950

COMBINED MANUAL AND AUTOMATIC GAIN CONTROL CIRCUIT

David D. Holmes, Princeton, N.J., assignor to Radio Corporation of America, a corporation of Delaware Filed July 1, 1957, Serial No. 669,108
8 Claims. (Cl. 250—20)

Figures 1, 2:
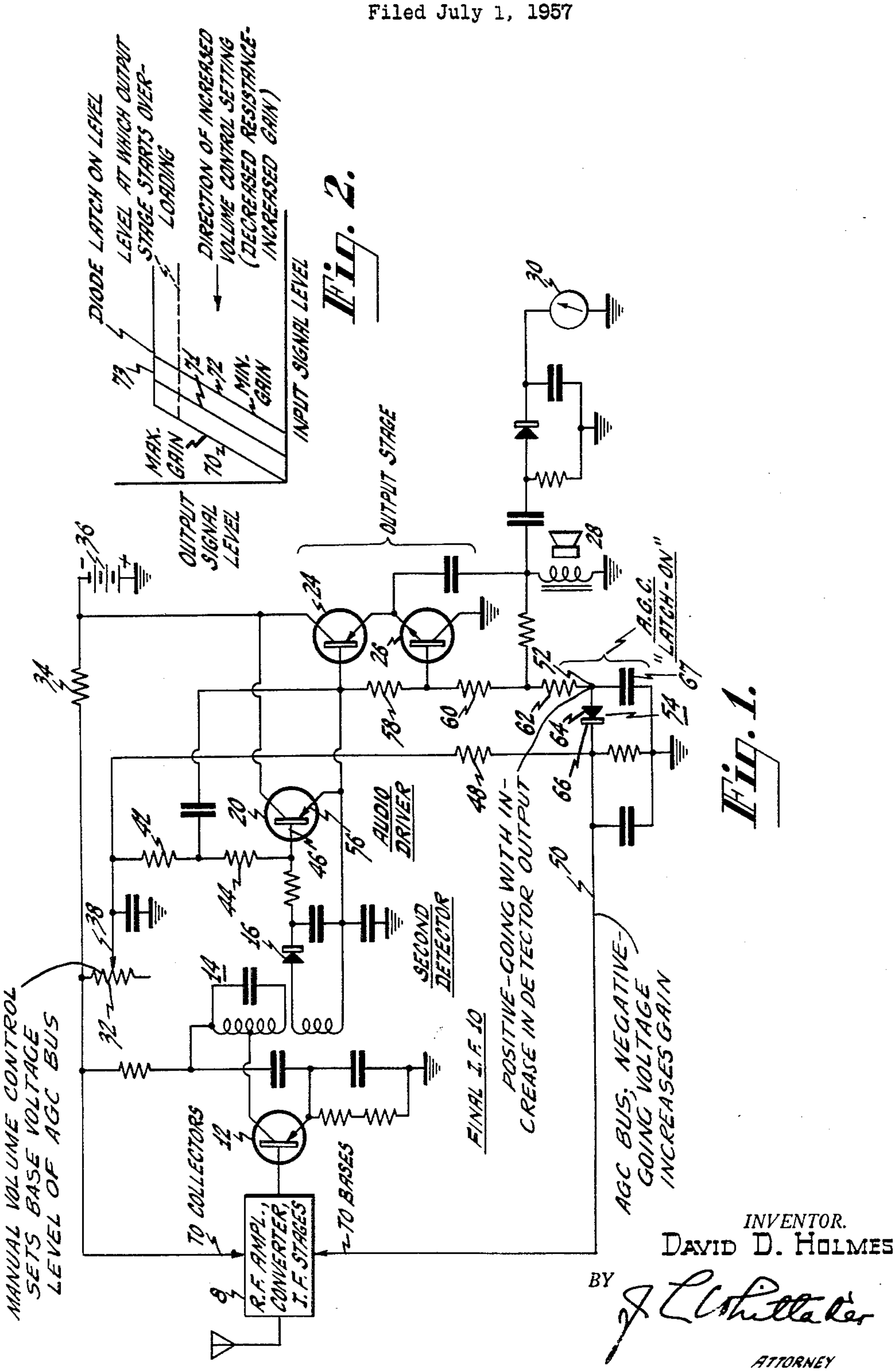

The present invention relates to radio receivers and particularly to improved gain control circuits for such receivers. While not restricted thereto, the invention is particularly useful in direction finder receivers.

An automatic gain control (AGC) circuit tends to maintain the signal output of a receiver at a constant level for wide ranges of input signal. This is disadvantageous in direction-finder receivers. Here, low amplitude signals must be detected in order to obtain highly accurate null indications, and automatic gain control circuits may tend to reduce the receiver sensitivity (gain) somewhat, even at low input signal levels. If the AGC circuits were removed, strong input signals would severely overload the receiver and cause distortion or even obliteration of the receiver output signal.

It is an object of the present invention to provide an improved automatic gain control circuit which overcomes the difficulties outlined above.

Another object of the invention is to provide an improved, transistorized automatic gain control circuit.

Yet another object of the invention is to provide an improved automatic gain control circuit which includes an automatic self-defeating feature.

The automatic gain control circuit of the present invention is rendered operative only in response to the tendency of the receiver to be driven into overload. At other times, the gain control circuit is automatically defeated. The circuit which defeats the AGC action includes a switch such as a diode in the gain control circuit which is maintained conductive in response to severe overload of the receiver but which is at other times driven beyond cut-off. The parameters sensed by the "defeat" circuit to determine receiver overload include the receiver volume control setting, the level of signal passing through the receiver, and the receiver gain.

The invention will be described in greater detail by reference to the following description taken in connection with the accompanying drawing in which:

Figure 1 is a block and schematic circuit diagram of a portion of a superheterodyne radio receiver showing the AGC circuit; and, Figure 2 is a graph to explain the operation of the circuit of Figure 1.

The superheterodyne receiver, shown in part in the drawing, includes an antenna, radio frequency amplifier, converter and several IF stages. These are shown by a single block 8. Stage 10 is the final intermediate frequency amplifier and includes a transistor 12. The output of the transistor is coupled via transformer 14 to the second detector 16, shown as a diode. The detector is direct-coupled to the audio driver 20, shown as a transistor. The audio driver is connected to a pair of transistors 24, 26 connected in complementary symmetry and forming the output stage. These transistors drive a loudspeaker 28. Meter 30 is for indicating a null.

The portions of the circuit described so far operate in a straightforward manner and need not be explained in detail. Transistors 12, 20 and 24 are PNP type, however, NPN type can be used instead, with minor circuit modification, as will be understood by those skilled in the art.

Volume control potentiometer 32 is connected through resistor 34 to the negative terminal of battery 36. The slider 38 of the potentiometer is connected to two resistance networks. The first 42, 44, leads to the base 46 of audio driver stage 20. The second, which includes resistor 48, leads to common bus 50 to the bases of the transistors comprising the first intermediate amplifier, radio frequency amplifier, and converter. The AGC voltage, which is developed at point 52, passes through AGC "latch-on" diode 54, when the latter conducts, to the gain control bus 50.

In operation, assume that it is desired to increase the receiver gain. This may be done by making the bases of the PNP transistors more negative. Adjustment of potentiometer 32 in a sense to decrease the resistance it inserts accomplishes this.

When the base 46 of the audio driver 20 is made more negative, the driver draws more current and emitter 56 becomes more negative. The emitter is connected through resistors 58, 60 and 62 to the anode 64 of diode 54. The anode therefore tends to become more negative and the diode tends to be driven further beyond cut-off. However, potentiometer 32 is also connected through resistor 48 to the cathode 66 of diode 54. Therefore, as the receiver gain is increased, cathode 66 becomes more negative and this tends to drive diode 54 into conduction. Since both anode and cathode are driven more negative by the action described, the two effects tend to balance.

When the gain of the receiver is increased, the output signal level of the final IF stage increases. The IF output signal is applied to the second detector 16. The latter is so poled that increased signal drives base 46 more positive and this, in turn, causes the transistor to conduct less current and emitter 56 to be driven more positive. A portion of the signal developed at emitter 56 is filtered by the resistor condenser network 62, 67 and applied to anode 64. Thus, the increased signal from the intermediate frequency stages, due to the increased receiver gain, causes anode 64 of diode 54 to tend to become more positive (in actuality, less negative). This tendency more than compensates for the tendency of anode 64 to be driven negative due to the bias applied to audio driver 20 by volume control potentiometer 32. Since cathode 66 is made more negative in increasing the receiver gain and, at the same time, anode 64 is made less negative by the increased signal applied to second detector 16, diode 54 is driven toward conduction.

The values of the circuit components described are such that any tendency of the receiver to overload to more than a predetermined extent causes the diode 54 to conduct and the AGC voltage at point 52 to be applied via bus 50 to the early receiver stages. On the other hand, when either the received signal level or the receiver gain is reduced, anode 64 becomes more negative than cathode 66, the diode 54 is cut-off, and the AGC action is defeated.

One can think of the above action in the following way. There are three parameters which must be taken into account to determine when diode 54 is driven into conduction. One is the volume control setting which, in this circuit, affects the receiver gain; the second is receiver gain; and the third is the incoming signal level. Reducing the receiver gain tends to defeat the AGC action. Reducing the input signal strength tends to defeat the AGC action. Increasing the receiver gain tends to re-establish the AGC action. However, in a preferred form of the invention, the circuit values are so chosen that even with the volume control adjusted for maximum receiver gain, the AGC action is defeated if the received signal is of sufficiently low amplitude (a null indication, for example).

Figure 2 shows, in a qualitative way, the mode of operation of the circuit. Each of curves 70, 71 and 72 represents a different volume control setting. Note that even at maximum gain, the AGC circuit is defeated for input signals of lower than a predetermined level. The level 73 at which diode 54 is rendered conductive is higher than that required to overload the receiver. This level can readily be adjusted by adjustment of the circuit parameters (for example, the values of the resistors in the voltage divider networks) and, in fact, may even be made lower than the overload level shown by dashed line 74.

In direction finder receiver applications, it is desirable to increase receiver output volume when approaching a null indication in order to obtain a sharp transition. If this were done in a receiver without an AGC circuit, the audio driver output signal on each side of the null would be of sufficient amplitude severely to overload the receiver. With the present circuit, however, as soon as the receiver tends to overload beyond a given point, diode 54 is rendered conductive and AGC action is established.

What is claimed is:

1. A gain control circuit for a radio receiver comprising, in combination, a gain control circuit extending from one of the final stages of the receiver to the control element of at least one of the earlier stages of the receiver, said circuit including a diode so poled that when it conducts it permits a gain control voltage to pass through said diode to said control element of said earlier stage, one element of the diode being connected to said earlier stage of the receiver; a volume control circuit in said receiver; circuit means connecting both elements of said diode to said volume control circuit; and circuit means connecting one of said elements of said diode to the signal channel of said receiver for sensing the amplitude of a signal passing through said receiver, the circuit constants of said two circuit means being such that the diode is rendered conductive only in response to receiver overload of more than a predetermined extent and rendered cut-off under other conditions.

2. In a radio receiver, in combination, an audio amplifier stage having a control element to which a bias may be applied, and a second element the potential of which varies as a function of said bias; a gain control circuit for sensing the voltage at said second element and deriving therefrom a gain control voltage; a switch in said gain control circuit which in one state permits the gain control voltage to pass and in another state prevents the same from passing; a volume control potentiometer connected to said control element for biasing said audio amplifier, and connected to said switch and tending to place the same in said one state in response to a setting producing high gain and in its other state in response to a setting producing low gain; and circuit means connected to said second element and responsive to a large amplitude input signal to said audio amplifier for tending to place said switch in said one state and to a low amplitude signal to said audio amplifier for tending to place said switch in its other state.

3. In a radio receiver, in combination, an audio amplifier comprising a transistor having base, collector and emitter electrodes; a gain control circuit for sensing the voltage at said emitter electrode and deriving therefrom a gain control voltage; a switch in said gain control circuit which in one state permits the gain control voltage to pass and in another state prevents the same from passing; a volume control potentiometer connected to said base for biasing said audio amplifier, and connected to said switch and tending to place the same in said one state in response to a setting producing high receiver output signal and in its other state in response to a setting producing low receiver output signal; and circuit means connected to said emitter electrode and responsive to a large amplitude input signal to said audio amplifier for tending to place said switch in said one state and to a low amplitude signal to said audio amplifier for tending to place said switch in its other state.

4. In the combination as set forth in claim 3, said switch comprising a diode.

5. In a radio receiver, in combination, an audio stage including an amplifying device having a control element, and a second element the potential of which depends upon the potential applied to said control element; a detector coupled to said control element for applying a voltage thereto which varies as an inverse function of the amplitude of the signal applied to the detector; an automatic gain control circuit connected to said second element for producing a gain control voltage which depends upon the value of the voltage developed at said second element; a volume control circuit; and a diode in said gain control circuit which, when it is cut off, blocks said gain control voltage, one element of said diode being connected to the volume control circuit and the other element of said diode being connected to said second element, the diode being so poled that change in the volume control setting in a sense to increase the receiver output signal tends to render the diode conductive, and increase in the level of the signal applied to said detector tends to render said diode conductive.

6. In a radio receiver as set forth in claim 5, said amplifying device comprising a transistor, said control element comprising the base of said transistor, and said second element comprising the emitter of said transistor.

7. In a radio receiver, a plurality of receiver stages at least one of which includes a control element to which a direct voltage may be applied for controlling the gain of that stage; a volume control circuit connected to one of said stages for adjusting the receiver gain; an output stage; and an automatic gain control circuit connected between said output stage and said control elements of said receiver stages and switching means in said gain control circuit responsive both to the voltage output of said volume control circuit and the signal output of said output stage for selectively applying a gain control voltage to said control elements of said receiver stages only in response to a given relationship between said voltage output of said volume control circuit and said signal output of said output stage.

8. In a radio receiver, a plurality of receiver stages at least some of which include a control element to which a direct voltage may be applied for controlling the gain of that stage; a volume control circuit connected to another of said stages for adjusting the receiver gain; an output stage; and an automatic gain control circuit connected between said output stage and said control elements of said receiver stages and switching means in said gain control circuit which in one state renders said control circuit operative and in another state renders said control circuit inoperative, said switching means being responsive both to the voltage output of said volume control circuit and the signal output of said output stage for applying a gain control voltage to said control elements of said receiver stages in response to a given relationship between said voltage output of said volume control circuit and said signal output of said output stage.

References Cited in the file of this patent

UNITED STATES PATENTS

| | | |
|---|---|---|
| 2,248,783 | Rinia | July 8, 1941 |
| 2,327,866 | Budenbom | Aug. 24, 1943 |
| 2,520,012 | Montgomery | Aug. 22, 1950 |
| 2,627,022 | Anderson | Jan. 27, 1953 |
| 2,802,100 | Beck et al. | Aug. 6, 1957 |
| 2,837,635 | Epperson | June 3, 1958 |
| 2,866,015 | Sarlor | Dec. 23, 1958 |

FOREIGN PATENTS

| | | |
|---|---|---|
| 764,428 | Great Britain | Dec. 28, 1956 |